United States Patent [19]

Pampalone et al.

[11] 4,262,073

[45] Apr. 14, 1981

[54] POSITIVE RESIST MEDIUM AND METHOD OF EMPLOYING SAME

[75] Inventors: Thomas R. Pampalone, Belle Mead; Emil J. Gavalchin, Princeton Junction, both of N.J.

[73] Assignee: RCA Corporation, New York, N.Y.

[21] Appl. No.: 96,973

[22] Filed: Nov. 23, 1979

[51] Int. Cl.$^3$ .............................................. G03C 5/00
[52] U.S. Cl. ...................................... 430/18; 430/326; 430/281; 430/286; 430/296; 430/942; 430/905; 430/966; 430/967; 204/159.14
[58] Field of Search ............... 430/281, 286, 942, 296, 430/326, 905, 966, 967, 18; 204/159.14; 528/392

[56] References Cited

U.S. PATENT DOCUMENTS

| 3,893,127 | 7/1975 | Kaplan et al. | 204/159.14 |
|---|---|---|---|
| 3,898,350 | 8/1975 | Gipstein et al. | 430/296 |
| 3,916,036 | 10/1975 | Gipstein et al. | 430/296 |
| 3,935,331 | 1/1976 | Poliniak et al. | 430/281 |
| 3,935,332 | 1/1976 | Poliniak et al. | 430/296 |
| 4,054,454 | 10/1977 | Himics et al. | 204/159.14 |

OTHER PUBLICATIONS

"Acetylene Polysulfones" by C. S. Marvel and W. W. Williams, Journal of American Chemical Society, vol. 61, Oct. 1939, pp. 2710-2714.

"Polysulfones From Acetylenes and Sulfur Dioxide" by L. L. Ryden and C. S. Marvel, Journal of American Chem. Soc., vol. 58, Oct. 1936, pp. 2047-2050.

Primary Examiner—Won H. Louie, Jr.
Attorney, Agent, or Firm—Birgit E. Morris; Edward J. Sites

[57] ABSTRACT

A recording medium is provided which is comprised of a substrate and a film of a polyacetylene sulfone on the surface of the substrate. The recording medium is especially useful in the microlithographic manufacture of electronic circuits using deep ultraviolet exposure.

10 Claims, 1 Drawing Figure

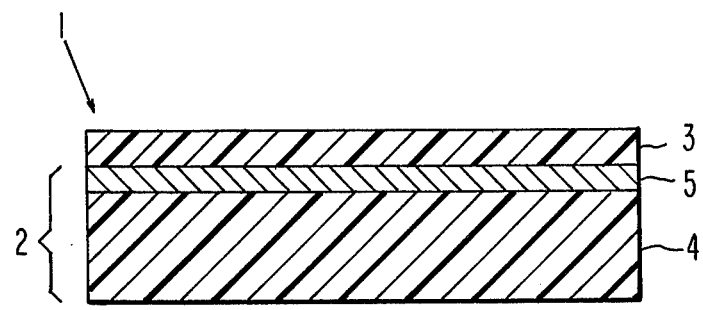

POSITIVE RESIST MEDIUM AND METHOD OF EMPLOYING SAME

This invention relates to a positive resist medium and to the method of employing the medium to record information. More particularly, this invention is concerned with a class of polymer which exhibit positive resist properties when exposed to radiation and to the use of these polymers as resists in the manufacture of electronic devices including microelectronic circuits.

BACKGROUND OF THE INVENTION

Substantial advances made in recent years in the electronic field have resulted in a reduction in the physical size and cost of electronic circuits and an increase in their speed of operation and reliability. Using the presently available technology, it is now possible to produce more than 1000 circuits on a substrate a few micrometers square with individual circuits having incorporated in their logic numerous components such as transistors, capacitors, resistors and the like.

These advances have been due to significant improvements in the fabrication processes employed for the manufacture of the microelectronic circuits. One such fabrication process which is widely employed for the manufacture of microelectronic circuits is known as microlithography. Using microlithography, a film of a radiation sensitive polymeric material, commonly known as a resist, is applied on a substrate; a portion of the layer of the polymeric material on the substrate is exposed to high energy radiation such as ultraviolet or other types of radiation, an electron beam, x-ray radiation or the like and the exposed resist is developed with a solvent to remove the solubilized portion. Polymeric materials which on exposure to radiation become more soluble are referred to as positive resists. Polymeric materials which become more insoluble as a result of exposure to radiation are referred to as negative resists. When employing a positive resist the exposure to the radiation is believed to reduce the molecular weight of the exposed portion of the polymeric layer. The exposed portion can then be removed or, as it is commonly referred to, developed with a solvent which preferentially dissolves the exposed lower molecular weight polymer, leaving a patterned protective layer of the original higher molecular weight polymer protecting the unexposed area. The resist remaining on the surface of the substrate is then employed as a protective mask to allow the selective etching or other treatment of the exposed portions of the substrate.

Photolithography is one form of microlithography. The exposure of the resist is made with either visible light or ultraviolet radiation. Photolithography has many inherent advantages over the other types of microlithography. The exposure can generally be conducted using relatively low cost apparatus and at ambient conditions. Typically the exposure is made by flood exposing the resist with ultraviolet radiation through a mask. This method is fast and inexpensive and makes photolithography especially suitable for mass production of high volume, low cost electronic circuits. However, using the resist materials heretofore suggested, there is a definite limitation with regard to the degree of resolution which is obtainable.

There is a current and anticipated demand for even higher density circuits which require even higher resolution. One of the more successful methods from a technical standpoint to obtain higher resolutions is to utilize a scanning modulated electron beam to expose a resist. However, electron beam lithography is expensive because of the initial high cost of the electron beam apparatus and the relatively low production rates obtainable. Thus, electron beam lithography is not commercially feasible for low-cost mass-produced circuits. Nevertheless, it would be highly advantageous to have a medium which could be exposed by a photolithographic method and which would have the resolution obtainable by exposure with an electron beam.

SUMMARY OF THE INVENTION

In accordance with this invention, there is provided a positive resist medium for microlithography which is comprised of a film of an acetylene sulfone polymer on the surface of a substrate. A microlithographic method of manufacturing microelectronic circuits is also provided in which the resist medium of this invention is preferably exposed with deep ultraviolet radiation and thereafter developed.

BRIEF DESCRIPTION OF THE DRAWING

The FIGURE is an illustration of the cross-section of the recording medium of this invention.

DETAILED DESCRIPTION OF THE INVENTION

The polymers which are employed as resists in this invention are polyacetylene sulfones which are represented by the formula

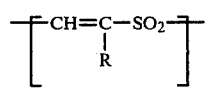

Formula I wherein R is an organic radical.

This general class of polymers is known and has been reported in the literature. The polymers have been described, for example, by L. L. Ryden and C. S. Marvel in 1936 in the Journal of American Chemical Society, volume 58, pages 2047–2050.

The acetylene sulfone polymers which are employed as resists in the method of this invention derive their usefulness because of the relative instability of the sulfur-carbon bond upon exposure to radiation. It has been found that these bonds in conjugation are especially sensitive to deep ultraviolet radiation without the need of ultraviolet sensitizers or the like.

The preferred polyacetylene sulfones for use in this invention are polymers of Formula I wherein the radical R is an alkyl, alicyclic, aryl, aralkyl, or heterocyclic organic radical. The number of carbons in the organic radical R is not particularly critical provided it is not so excessively large as to adversely interfere with the radiation sensitivity of the polymer. Polyacetylene sulfone compounds wherein the group R is straight-chained or branch-chained alkyls having 1–12 carbon atoms or an alicyclic, aryl, aralkyl radical having up to 20 carbon atoms are particularly suitable for employment in this invention. The preferred class of polyacetylene sulfone polymers for use in this invention from both the ease of preparation and the reactivity on exposure to radiation are those in which R is an alkyl group having 1–12 carbon atoms.

The molecular weight of the polymers employed in this invention should be sufficiently high so that when areas of the polymer are exposed to radiation, there can be a sufficient reduction in molecular weight that there will be a significant difference in the relative solubility of the exposed and unexposed portions of the polymer. The requirements for the molecular weight will vary to some extent depending upon the type of group which is employed as the R substituent. However, in general, a molecular weight of about 50,000 to 500,000 or even higher is satisfactory for the purposes of this invention.

The polyacetylene sulfones can be prepared by free radical polymerization of the acetylene monomer and sulfur dioxide. The molecular weight is controlled by the amount of polymerization initiator employed with increased amounts giving lower molecular weights.

To apply the polymers to a substrate, the polymers are initially dissolved in a solvent. Films of the polymeric solution are then cast, spun coated, sprayed, or the like on the substrate which is desired to be coated. The solution of the polymer generally contains between about 1 and 20% by weight of the polymer. Suitable solvents should have boiling points which are below the decomposition points of the polymer to permit removal of the solvent from the films stored on the substrate by heating or by vacuum drying. Examples of suitable solvents for the polyacetylene sulfone polymers used in this invention are, for example, cyclohexane, cycloheptanone, 2-methyl cyclohexanone and acetone.

The films can be cast on the substrate in various thicknesses from about 50 angstroms to 10 microns depending upon the intended use of the resist image.

It is preferable to bake the resist film in air or vacuum usually at a temperature above the glass transition temperature of the polymer, but below its thermal decomposition temperature. The baking removes traces of solvent and anneals out stresses and strains in the film.

The recording medium 1 of this invention, as illustrated in the FIGURE, is comprised of a substrate 2 and a film of the polyacetylene sulfone 3 on the surface of the substrate. When it is desired to form a printed circuit the substrate 2 can be comprised of an organic plastic base 4 having a layer of a metal 5 such as copper on its surface.

The resist on the substrate is then selectively exposed to radiation. The radiation which is employed can be ultraviolet, electron beam, x-ray, gamma ray, or the like. It has been found that the polymers of this invention are especially useful when exposed with ultraviolet radiation. The polymers exhibit extremely good sensitivity to deep ultraviolet radiation, that is ultraviolet radiation having a wavelength from about 200 to 300 nanometers, although R substituents with extended conjugation, such as aryl groups, will exhibit sensitivity at even longer wavelengths. The sensitivity of the polyacetylene sulfones to the deep ultraviolet radiation provides a number of significant advantages. Exposure with deep ultraviolet radiation makes it possible to have extremely fine resolution approaching that of electron beam radiation. The advantage of deep ultraviolet radiation is that the exposure can be conducted by flood exposure techniques without the requirement of vacuum chambers and the like such as are required for electron beam radiation exposure.

While specific attention has been drawn to the use of deep ultraviolet radiation for use as the exposure means for the polymers of this invention, it should be noted the polymers likewise exhibit excellent sensitivity to electron beam and x-ray radiation.

The solvent development of the exposed media can be conducted in a number of different ways. The development is generally conducted at a temperature in the range of 10° to 50° C.

One development method is to use a solvent which will dissolve both the exposed and unexposed portions but dissolve the exposed portion more rapidly. The resist thickness is adjusted so that even though there is some loss of the unexposed polymer, the remainder of the unexposed film will be thick enough to protect the underlying substrate.

An alternate type of development system is to employ a solvent which exclusively dissolves the exposed portion. This technique tends to give sharper resolution but generally requires longer and more careful developing than the use of a common solvent.

The resist film, after the exposed portion is removed, provides a pattern on the substrate which is used as a guide for the formation of circuits and the like.

The substrates which may be advantageously treated in accordance with this invention may be, for example, organic plastic laminate, porcelain coated steel, ceramic wafers, chrome or nickel coated glass, and the like, on which it is desired to form a microelectronic circuit.

The following examples are given by way of further illustration of the present invention but are not intended to limit the invention beyond that of the attached claims.

EXAMPLE 1

About 30 ml of liquid sulfur dioxide and 0.1 ml of t-butylhydroperoxide initiator were placed in a reactor equipped with a mechanical stirrer and maintained at −60° C. with an acetone/dry ice bath. The system was continuously flushed with dry nitrogen gas at atmospheric pressure. Ten ml of 1-hexyne was added with stirring at a rate to maintain a constant temperature of −60° C. After addition, the reaction was allowed to stand for one hour, then opened to the atmosphere and allowed to warm to room temperature. The reaction product was dissolved in 100 ml of methylene chloride, precipatated in methyl alcohol, collected, and vacuum-dried at 40° C. The yield was approximately 90%. Elemental analyses and IR spectra support a 1:1 alternating polyacetylene sulfone structure. The weight average molecular weight by light scattering was 500,000. The polydispersity was 5.

EXAMPLE 2

Example 1 was repeated with the exception that 1-heptyne was used as the acetylene monomer.

EXAMPLE 3

Example 1 was repeated with the exception that 1-pentyne was used as the acetylene monomer.

EXAMPLE 4

Poly (1-hexyne sulfone) polymer prepared in Example 1 was dissolved in cyclopentanone to provide a 12% solution. The solution was spun coated on a nickel-plated substrate. The coated substrate was dried for one hour in an oven set at 100° C. The coated substrate was then exposed through a test mask with deep ultraviolet radiation having a wavelength of 253 nanometers. The exposure was conducted by holding the sample five inches from a medium pressure mercury lamp. The exposure dosage was 700 mj/cm$^2$. The exposed sample was developed with methylacetoacetate. The developed sample showed sharp clean deliniations between the exposed and unexposed portions. The sample was etched with a nickel etchant and then the resist was stripped. The nickel lines were sharp and definition of two micron wide lines was easily obtained.

EXAMPLE 5

Example 4 was repeated with the exception that poly-1-(heptyne sulfone) prepared in Example 2 was employed as the polyacetylene sulfone coating. The results were substantially identical.

EXAMPLE 6

The two polyacetylene sulfones, poly(1-heptyne sulfone) and poly(1-hexyne sulfone), were dissolved in methylcellosolve acetate and spin-coated on a chrome substrate to a thickness of about 6000 angstroms and then exposed through a low resolution mask (3 mm bars with 3 mm spacings) at doses 5, 10, and 15 $\mu C/cm^2$ at 10 KeV. Both polymers were sensitive down to 5 $\mu C/cm^2$. The developers used for both and the results at 5 $\mu C/cm^2$ are shown.

| Developer | Result |
| --- | --- |
| methylcellosolve acetate/ 2-methylcyclohexanone (4/1) | good delineated pattern |
| ethyl acetoacetate | good delineated pattern |
| isopropylacetate | good delineated pattern |
| methylcellosolve acetate | fair differential solubility |
| isopropyl alcohol/acetone (1:1) | fair differential solubility |

What is claimed is:

1. A recorded microlithographic medium comprised of a substrate and a radiation sensitive film applied to a surface of the substrate, said film consisting essentially of an acetylene sulfone polymer consisting of repeating units of the formula

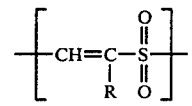

wherein R is an organic radical, said polymer having a molecular weight of at least about 50,000 said film having information in the form of a surface relief pattern.

2. The medium according to claim 1 wherein R is an organic radical selected from the group consisting of alkyl, alicyclic, aryl, aralkyl and heterocyclic.

3. The medium according to claim 2 wherein R is an organic radical selected from the group consisting of alicyclic, aryl, aralkyl and heterocyclic having up to 20 carbon atoms.

4. The medium according to claim 1 wherein R is an alkyl group having 1-12 carbon atoms.

5. The medium according to claim 1 wherein said polymer has a molecular weight of from 50,000 to 200,000.

6. The medium according to claim 1 wherein said acetylene sulfone polymer is poly(l-hexyne sulfone).

7. The medium according to claim 1 wherein said acetylene sulfone polymer is poly(1-heptyne sulfone).

8. The medium according to claim 1 wherein said acetylene polymer is poly(1-pentyne sulfone).

9. The method for recording information which comprises selectively exposing the microlithographic recording medium in predetermined areas thereof which correspond to the information to be recorded with radiation in an amount sufficient to increase the solubility of the exposed portions of the film relative to the unexposed portions of the film in a developer solvent, and thereafter developing the exposed medium with the developer solvent so as to remove the more soluble exposed areas of the film whereby an information-containing surface relief image is recorded in the medium.

10. The method according to claim 9 wherein the recording medium is exposed with deep ultraviolet radiation.

* * * * *

UNITED STATES PATENT AND TRADEMARK OFFICE
CERTIFICATE OF CORRECTION

PATENT NO. : 4,262,073

DATED : Apr. 14, 1981

INVENTOR(S): Thomas R. Pampalone et al.

It is certified that error appears in the above-identified patent and that said Letters Patent is hereby corrected as shown below:

Column 1, line 8, "polymer" should read -- polymers --.
Column 3, line 26, "cyclohexane" should read -- cyclohexanone --.
Column 6, line 28, claim 8, "acetylene polymer" should read
-- acetylene sulfone polymer --. Column 6, line 29, cancel
beginning with "9. The method for" to and including "in
the medium." in column 6, line 39, and insert the following
claim:

9. The method for recording information
which comprises selectively exposing the
microlithographic recording medium comprised of
a substrate and a radiation sensitive film applied
to a surface of the substrate, said film consisting
essentially of an acetylene sulfone polymer consist-
ing of repeating units of the formula

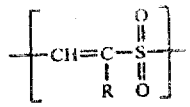

wherein R is an organic radical, said polymer
having a molecular weight of at least about
50,000 in predetermined areas thereof which

UNITED STATES PATENT AND TRADEMARK OFFICE
CERTIFICATE OF CORRECTION

PATENT NO. : 4,262,073

DATED : Apr. 14, 1981

INVENTOR(S) : Thomas R. Pampalone et al.

It is certified that error appears in the above-identified patent and that said Letters Patent is hereby corrected as shown below:

correspond to the information to be recorded with radiation in an amount sufficient to increase the solubility of the exposed portions of the film relative to the unexposed portions of the film in a developer solvent, and thereafter developing the exposed medium with the developer solvent so as to remove the more soluble exposed areas of the film whereby an information-containing surface relief image is recorded in the medium.

Signed and Sealed this

Eleventh Day of August 1981

[SEAL]

Attest:

GERALD J. MOSSINGHOFF

Attesting Officer

Commissioner of Patents and Trademarks